United States Patent [19]

Ahuja et al.

[11] 4,276,486
[45] Jun. 30, 1981

[54] TWO TERMINAL POWER CONTROL SWITCH WITH TRIAC CURRENT POWERED CONTROL MEANS

[75] Inventors: Arjan D. Ahuja, Torrance; James E. Brewer, Anaheim, both of Calif.

[73] Assignee: Hughes Aircraft Company, Culver City, Calif.

[21] Appl. No.: 12,682

[22] Filed: Feb. 16, 1979

[51] Int. Cl.³ .............................................. H03K 17/60
[52] U.S. Cl. ........................... 307/252 B; 307/252 N; 307/252 UA
[58] Field of Search ......... 307/252 B, 252 UA, 252 N

[56] References Cited

U.S. PATENT DOCUMENTS

| | | | |
|---|---|---|---|
| 3,656,005 | 4/1972 | Lee | 307/252 B |
| 3,688,130 | 8/1972 | Granieri | 307/252 B |
| 3,801,832 | 4/1974 | Joyce | 307/252 B |
| 3,890,562 | 6/1975 | West | 307/252 UA |
| 4,011,482 | 3/1977 | Seib | 307/252 B |
| 4,081,660 | 3/1978 | Offer et al. | 307/252 B |
| 4,199,694 | 4/1980 | Van Zeeland | 307/252 UA |

OTHER PUBLICATIONS

"Neue Wege der Schaltungstechnik," Electronik--Woustrie vol. 6 #7,8, Jul.-Aug. 1975, pp. 156-157.

*Primary Examiner*—Joseph E. Clawson, Jr.
*Attorney, Agent, or Firm*—Kenneth W. Float; William H. MacAllister

[57] ABSTRACT

A switching arrangement including a current switch for providing a low impedance electrical path therethrough in response to the application of triggering signals thereto, and for providing a high impedance electrical path in the absence of the triggering signals, is connected in an electrical path between a load and an AC voltage source. A control circuit is provided for applying triggering signals to the current switch when enabling power is applied thereto. A normally open switch provides enabling power derived from the AC voltage source to the control circuit when the normally open switch is closed. A normally closed switch provides enabling power derived from current which flows through the current switch to the control circuit when the normally closed switch is closed. Upon momentary closure of the normally open switch, the switching arrangement is turned on. Upon momentary opening of the normally closed switch, or upon the momentary interruption of the AC voltage supplied to the switching arrangement, the switching arrangement is turned off.

6 Claims, 3 Drawing Figures

TWO TERMINAL POWER CONTROL SWITCH WITH TRIAC CURRENT POWERED CONTROL MEANS

BACKGROUND OF THE INVENTION

The present invention relates to power control switches and, more particularly, to two terminal switches which may be turned off remotely.

Prior to the present energy crisis, it was more cost effective to waste inexpensive electricity purchased at bulk rates, than have individual switches installed in offices of large buildings, industrial plants, or other facilities. However, because of the present high cost of electricity, and the national need to conserve energy, it is now desirable to provide for more efficient use of electricity in such applications.

Present practice in many large buildings is to have a main circuit breaker to control the lighting to a number of individual offices, without a separate light switch in each office. This practice is both inconvenient and highly inefficient.

Thus, not only is there a need for separate light switches which allow for turn-on and turn-off of individual office lights, but also a light switch which provides for remote turn-off of all lights while retaining individual turn-on and turn-off capability.

Existing three and four terminal solid state switches, which may be remotely controlled, are suitable in many applications. However, they do require either a third wire from the AC line or an external control line, either of which are disadvantageous in other applications. Also, these three and four terminal switches use half cycle zero voltage crossing circuits to gate a triac on. Such configurations, when used with inductive loads, such as fluorescent lights, for example, create undesirable radio frequency interference (RFI) type signals. Additionally, present two terminal switches, such as commercially available solid state dimmer switches, are phase control circuits designed for use with incandescent lamps only, and cannot be remotely controlled.

SUMMARY OF THE INVENTION

Accordingly, it is an object of the present invention to provide a solid state power control switch which can directly replace a conventional two terminal mechanical wall switch and allow for remote turn-off.

It is a further object of the present invention to provide a switch designed to operate with both resistive and inductive loads.

In accordance with these and other objects of the present invention, there is provided a switching arrangement for electrically interconnecting a load to an AC voltage source. The switching arrangement may be turned on and off locally by switches on the switching arrangement or turned off remotely by momentarily interrupting the AC voltage supplied to the switching arrangement.

The switching arrangement includes a current switch for providing a low impedance electrical path therethrough in response to the application of triggering signals thereto, and for providing a high impedance electrical path in the absence of the triggering signals. The current switch is connected in the electrical path between the load and AC voltage source.

A control circuit is provided for applying triggering signals to the current switch when enabling power is applied thereto. A normally open switch provides enabling power derived from the AC voltage source to the control circuit when the normally open switch is closed. A normally closed switch provides enabling power derived from current which flows through the current switch to the control circuit when the normally closed switch is closed.

Upon momentary closure of the normally open switch, the switching arrangement is turned on. Upon momentary opening of the normally closed switch, or upon the momentary interruption of the AC voltage supplied to the switching arrangement, the switching arrangement is turned off.

In one particular embodiment of the present invention, the switching arrangement may include a triac, or the like, as the current switch, and may include a transformer, or the like, to provide enabling power to the control circuit after the switching arrangement is initially turned on and operating.

The switching arrangement may be used to control both resistive and inductive loads. The current switch is triggered at each half cycle zero crossing of the load current passing therethrough instead of conventional triggering at half cycle zero crossings of the load voltage, which reduces radio frequency interference.

BRIEF DESCRIPTION OF THE DRAWINGS

The foregoing and other objects and features of the present invention may be more readily understood with reference to the following detailed description taken in conjunction with the accompanying drawings, wherein like reference numerals designate like structural elements, and in which.

DETAILED DESCRIPTION

Figure 1:
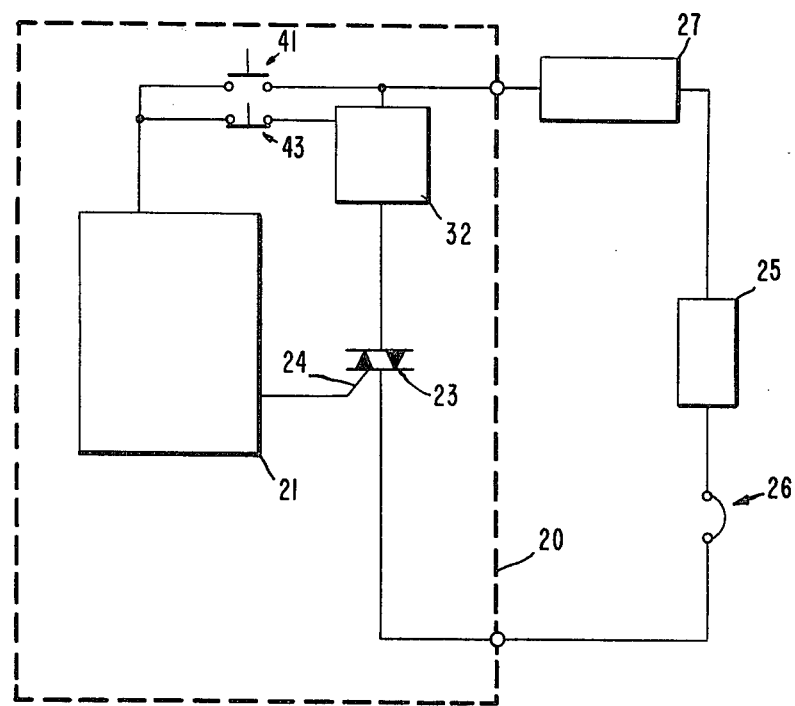
FIG. 1 is a schematic diagram of a switch made in accordance with the present invention.

Referring to the drawings, FIG. 1 shows a power control switch 20 made in accordance with the present invention. The power control switch comprises current sensing means 32 in series with a triac 23, and control circuitry 21 coupled to the current sensing means 32 and a gate 24 of the triac 23. A first terminal of the current sensing means 32 is connected in series with an electrical load 27 and one terminal (neutral) of an AC power source 25. A second terminal of the current sensing means 32 is connected to one terminal of the triac 23, while a second terminal of the triac 23 is connected in series with a circuit breaker 26 and a second terminal of the power source 25 to complete the electrical circuit.

The first terminal of the current sensing means 32 is also connected through a normally open switch 41 to the control circuit 21. A third terminal of the current sensing means is connected in series with a normally closed switch 43 and hence to the control circuit 21. The normally open switch 41 and the normally closed switch 43 are connected to the control circuit 21 at the same point.

A triac is an acronym that has been coined to identify a triode (three electrode) AC semiconductor which is triggered into conduction by a gate signal in a manner similar to the action of a silicon controlled rectifier (SCR). The triac, generally called a bidirectional triode thyristor, (see U.S. Pat. No. 3,275,909) differs from an SCR in that it may conduct in both directions of current flow in response to a positive or negative gate signal. Typical of a triac for use in the circuit of FIG. 1 is model number T6426M, or equivalent, manufactured by RCA.

Figure 2:
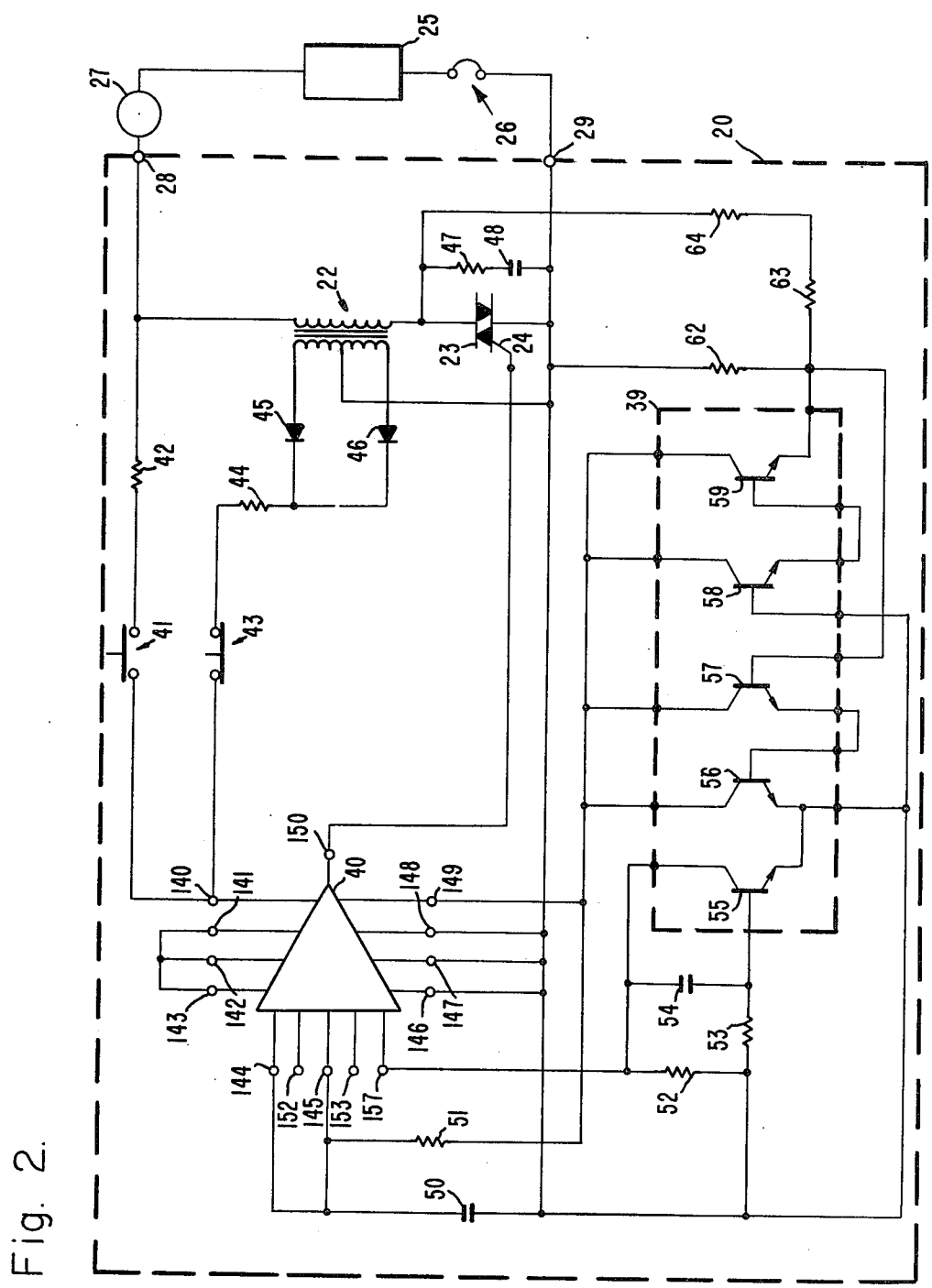
FIG. 2 is a schematic diagram of control circuitry for use in the switch of FIG. 1.

Referring now to FIG. 2, there is shown a detailed schematic diagram of the power control switch 20. The neutral terminal of the AC power source 25 is connected in series with a resistive or inductive load 27. The load 27 is connected in series to a first terminal 28 of the power control switch 20 and a resistor 42 and then to a normally open switch 41 and finally to a terminal 140 of an amplifier 40. The terminal 140 of the amplifier is also connected to a normally closed switch 43 in series with a resistor 44 and then to two rectifier diodes 45, 46 which are separately connected to opposite ends of a secondary winding of the transformer 22. A center tap terminal of the secondary winding of the transformer 22 is connected to the other terminal of the power source 25 by way of a second terminal 29 of the power control switch 20 in series with the circuit breaker 26. The resistor 44, rectifier diodes 45, 46 and transformer 22 comprise the current sensing means 32 of FIG. 1.

The primary winding of the transformer 22 has one end connected between the first terminal 28 and the resistor 42. The other end of the primary winding of the transformer 22 is connected to one end of the triac 23. The other end of the triac 23 is connected to the second terminal 29. A shunting resistor 47 and capacitor 48 are connected across the triac 23.

Terminals 141, 142 and 143 of the amplifier 40 are connected together, while terminals 146, 147 and 148 are connected to the second terminal 29 and thence to the circuit breaker 26 and power source 25. Terminal 144 is connected through a capacitor 50 to the second terminal 29 and also to a common point between two resistors 52, 53. Terminal 145 is also connected to resistors 52, 53 through capacitor 50. Additionally, terminal 145 is connected through a resistor 51 to terminal 149 of the amplifier 40 and to the collectors of four NPN transistors 56, 57, 58, 59, which may comprise part of a separate IC chip 39, such as an RCA model CA3086, or the like. An output terminal 150 of the amplifier 40 is connected to a gate terminal 24 of the triac 23. Terminals 152 and 153 of the amplifier 40 are not used, and thus are left unconnected.

Terminal 151 of the amplifier 40 is connected to resistor 52 and to a capacitor 54 and to the collector of a transistor 55. Resistor 53 is connected to the capacitor 54 and then to the base of transistor 55. The emitters of transistors 55 and 56 are connected together and also connected to the base of transistor 58 and to the second terminal 29. The base of transistor 56 is connected to the emitter of transistor 57. The base of transistor 57 is connected to the second terminal 29 through a resistor 62, and also to the emitter of transistor 59 and through two resistors 63, 64 to a point between the transformer 22 and the triac 23. The emitter of transistor 58 is connected to the base of transistor 59.

Figure 3:
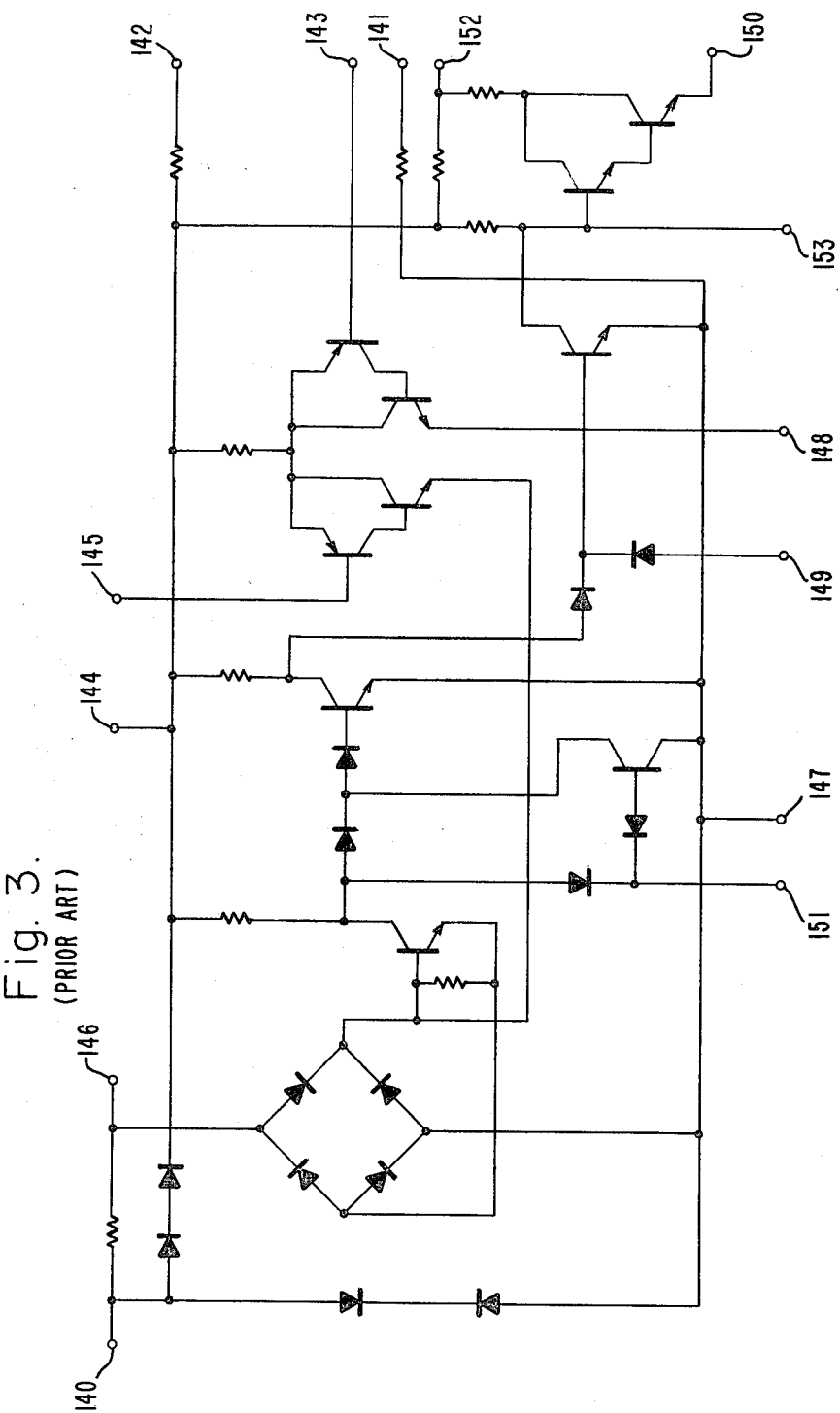
FIG. 3 is a schematic diagram of an amplifier for use in the control circuit of FIG. 2.

Referring now to FIG. 3, there is shown a schematic of an amplifier for use in the circuit of FIG. 2. This is a commercially available IC chip, such as model number CA3059, or the like, manufactured by RCA, and its construction will not be described herein. Generally, however, the amplifier 40 is a multistage circuit comprising a limiter power supply, differential amplifier, zero crossing detector and a triac gating circuit. The terminals 140–153 are identified for clarity.

In operation, the power control switch 20 functions in the following manner. The differential amplifier and zero crossing circuits of FIG. 3 are disabled by the shorting of terminals 144 to 145 and 146 to 147, respectively. An array of five NPN transistors 55–59, which may be provided on a separate plug-in IC chip 39, is provided, four of which (56–59) detect the absence of load current by sensing the voltage across the triac 23.

The base of transistor 57 supplies a positive line voltage drive signal to transistors 56, 57 which form a Darlington pair. The emitter of transistor 59 supplies a negative line voltage drive signal to transistors 58, 59, which also form a Darlington pair.

When the normally open switch 41 is momentarily closed, a DC operating voltage is provided to the various stages of the amplifier 40 along with a start up circuit comprised of resistors 52, 53, capacitor 54 and transistor 55. The start up circuit initiates a two millisecond low positive voltage at terminal 151 of the amplifier 40. This prevents the gate drive transistors of the amplifier 40 from turning on, which allows capacitor 50 to charge to its full DC operating voltage before the triac 23 is gated on.

At the end of the two millisecond delay, terminal 151 of the amplifier 40 goes to a high positive voltage which turns on the output transistors of the amplifier 40. This provides a gate drive signal at terminal 150 to turn on the triac 23. Once the triac 23 is turned on, current may flow from the AC power source 25 through the load 27, through the primary winding of the transformer 22, through the triac 23 and back to the AC power source 25. The current flow in the primary winding of the transformer 22 produces an AC voltage at the secondary winding which is transferred by the rectifier diodes 45, 46 through the normally closed switch 43 to terminal 140 of the amplifier 40.

After the initial half cycle voltage, the triac 23 commutates off when the current passes through zero. If the next half cycle voltage is positive, a positive line voltage in excess of $2V_{BE}$ for transistors 56 and 57 applied to the base of transistor 57 turns on transistors 56 and 57 to produce a low positive voltage at terminal 149 of the amplifier 40. This in turn produces a high positive gate drive voltage at terminal 150 of the amplifier 40 which turns on the triac 23.

After the triac 23 is on, the voltage across it is less than three volts which turns off transistors 56 and 57. This action produces a high positive voltage at terminal 149 of the amplifier 40 and removes the gate drive voltage to the triac 23.

As the current through the triac 23 crosses zero, the triac 23 commutates off which causes an increase in the line voltage across the triac 23 in a negative direction. A negative line voltage in excess of $2V_{BE}$ for transistors 58 and 59 allows these transistors to turn on and to produce a low voltage at terminal 149 of the amplifier 40. This in turn turns on the triac 23 as described hereinabove.

Once the triac 23 is on, transistors 58 and 59 turn off to remove the gate drive voltage to the triac 23. As the current crosses zero, the triac 23 commutates off which causes an increase in the line voltage across the triac 23 in a positive direction. This turns on transistors 56 and 57 to again repeat the above-described turn-on and turn-off operations.

The power control switch 20 may be turned off by momentarily depressing the normally closed switch 43 or remotely by momentarily turning off the AC power to the power control switch 20. This may be accomplished by opening and closing the circuit breaker 26 manually, or by means of a computer control, or the like. Load current may be turned on again by momentarily depressing the normally open switch 41.

This particular circuit was tested and operates satisfactorily for loads from 0.5 amperes to 5.0 amperes. This load current value may be further increased by providing a larger transformer core and triac rated for larger current.

Thus, there has been described a power control switch which may directly replace a conventional two terminal mechanical wall switch, which allows for remote turn off, and which may be operated using either resistive or inductive loads.

It is to be understood that the above-described embodiment is merely illustrative of but a small number of the many possible specific embodiments which can represent applications of the principles of the present invention. In particular, we do not want to be limited to the particular circuit or amplifier configuration chosen in the above-described embodiment. Clearly, numerous and varied other arrangements can be readily devised in accordance with these principles by those skilled in the art without departing from the spirit and scope of the invention.

What is claimed is:

1. A switching arrangement for electrically interconnecting a load to an AC voltage source, said switching arrangement having the capability of being turned on and off by circuits of said switching arrangement, and the additional capability of being turned off by the momentary interrupting the AC voltage supplied by said AC voltage source, said switching arrangement comprising:
   current switching means for providing a low impedance electrical path therethrough in response to the application of triggering signals thereto, and for providing a high impedance electrical path in the absence of said triggering signals, said current switching means being connected in an electrical path between said load and said AC voltage source;
   control circuit means for applying triggering signals to said current switching means when enabling power is applied thereto;
   first switch means including a normally open switch for supplying enabling power derived from said AC voltage source to said control circuit means when said normally open switch is closed, and whereupon momentary closure of said normally open switch turns on said switching arrangement; and
   second switch means including a normally closed switch for supplying enabling power derived from current which flows through said current switching means to said control circuit means when said normally closed switch is closed, and whereupon momentary opening of said normally closed switch or upon the momentary interruption of the AC voltage supplied to said switching arrangement turns off said switching arrangement.

2. The switching arrangement of claim 1, wherein said current switching means comprises a triac.

3. The switching arrangement of claim 1 or 2, wherein said second switch means further comprises a transformer having a primary winding thereof connected in series with said load and said AC voltage source, and having a secondary winding thereof coupled to said normally closed switch for supplying enabling power derived from current which flows through said current switching means to said control circuit means.

4. The switching arrangement of claim 3, wherein said control circuit means includes means for providing triggering signals to said current switching means at each half cycle zero crossing of the current passing through said current switching means.

5. A switching arrangement for electrically interconnecting a load to an AC voltage source, said switching arrangement having the capability of being turned on and off by circuits of said switching arrangement, and the additional capability of being turned off by the momentary interrupting the AC voltage supplied by said AC voltage source, said switching arrangement comprising:
   a triac for providing a low impedance electrical path therethrough in response to the application of triggering signals thereto, and for providing a high impedance electrical path in the absence of said triggering signals, said triac being connected in an electrical path between said load and said AC voltage source;
   control circuit means for applying triggering signals to said triac when enabling power is applied thereto;
   first switch means including a normally open switch for supplying enabling power derived from AC voltage source to said control circuit means when said normally open switch is closed, and whereupon momentary closure of said normally open switch turns on said switching arrangement; and
   second switch means, including a normally closed switch and transformer having a primary winding thereof connected in series with said load and said AC voltage source, and having a secondary winding thereof coupled to said normally closed switch, for supplying enabling power derived from current which flows through said triac to said control circuit means when said normally closed switch is closed, and whereupon momentary opening of said normally closed switch or upon the momentary interruption of the AC voltage supplied to said switching arrangement turns off said switching arrangement.

6. The switching arrangement of claim 5, wherein said control circuit means includes means for providing triggering signals to said triac at each half cycle zero crossing of the current passing through said triac.

* * * * *